United States Patent
Su et al.

(10) Patent No.: US 12,159,878 B2
(45) Date of Patent: Dec. 3, 2024

(54) ARRAY SUBSTRATE AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Qiujie Su, Beijing (CN); Zhihua Sun, Beijing (CN); Tao Yang, Beijing (CN); Dongchuan Chen, Beijing (CN); Yingmeng Miao, Beijing (CN); Jiantao Liu, Beijing (CN); Seungmin Lee, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/637,485

(22) PCT Filed: Mar. 26, 2021

(86) PCT No.: PCT/CN2021/083291
§ 371 (c)(1),
(2) Date: Feb. 23, 2022

(87) PCT Pub. No.: WO2022/198639
PCT Pub. Date: Sep. 29, 2022

(65) Prior Publication Data
US 2024/0055440 A1    Feb. 15, 2024

(51) Int. Cl.
*G02F 1/1343* (2006.01)
*G02F 1/1362* (2006.01)
(Continued)

(52) U.S. Cl.
CPC ...... *H01L 27/124* (2013.01); *G02F 1/134345* (2021.01); *G02F 1/136286* (2013.01); *G02F 1/1368* (2013.01)

(58) Field of Classification Search
CPC ..................................................... G02F 1/1343
See application file for complete search history.

(56) References Cited

U.S. PATENT DOCUMENTS 10,571,768 B2    2/2020    Gao
2019/0004383 A1  1/2019    Gao
(Continued)

FOREIGN PATENT DOCUMENTS

CN    101096256 A    6/2011
CN    102096256 A    6/2011
(Continued)

OTHER PUBLICATIONS

Written Opinion from PCT/CN2021/083291 dated Dec. 31, 2021.

*Primary Examiner* — Sang V Nguyen
(74) *Attorney, Agent, or Firm* — Calfee, Halter & Griswold LLP

(57) ABSTRACT

The present disclosure relates to an array substrate and a display device. The array substrate may include: a first substrate, and a plurality of pixel groups and a plurality of columns of data lines formed on the first substrate; wherein the plurality of pixel groups are arranged in an array along a row direction and a column direction, and each pixel group includes two sub-pixels arranged in the row direction; at least one sub-pixel of one of any two adjacent pixel groups in the row direction corresponds to the same color as one sub-pixel of the other pixel group; and any two adjacent sub-pixels in the row direction correspond to different colors; and each column of data line and each column of pixel groups are alternately arranged in the row direction.

20 Claims, 10 Drawing Sheets

(51) Int. Cl.
*G02F 1/1368* (2006.01)
*H01L 27/12* (2006.01)

(56) References Cited

U.S. PATENT DOCUMENTS

2021/0049971 A1* 2/2021 Xiao ............... G06F 3/0412
2021/0132426 A1* 5/2021 Yoshida ............ G06F 3/04164

FOREIGN PATENT DOCUMENTS

| CN | 102096256 B | 6/2012 |
| CN | 106292110 A | 1/2017 |
| CN | 109856874 A | 6/2019 |
| CN | 110308599 A | 10/2019 |
| CN | 111338144 A | 6/2020 |

* cited by examiner

ARRAY SUBSTRATE AND DISPLAY DEVICE

CROSS-REFERENCE TO THE RELATED APPLICATION

The present application is based upon International Application No. PCT/CN2021/083291, filed on Mar. 26, 2021, entitled "ARRAY SUBSTRATE AND DISPLAY DEVICE", the entire contents of which are hereby incorporated by reference.

TECHNICAL FIELD

The present disclosure relates to the field of display technologies, and in particular, to an array substrate and a display device.

BACKGROUND

With the continuous development of liquid crystal panels, high-resolution products are constantly being developed.

SUMMARY

An objective of the present disclosure is to provide an array substrate and a display device.

A first aspect of the present disclosure provides an array substrate, including: a first substrate, and a plurality of pixel groups and a plurality of columns of data lines formed on the first substrate;

wherein the plurality of pixel groups are arranged in an array along a row direction and a column direction, and each pixel group includes two sub-pixels arranged in the row direction; at least one sub-pixel of one of any two adjacent pixel groups in the row direction corresponds to the same color as one sub-pixel of the other pixel group; and any two adjacent sub-pixels in the row direction correspond to different colors; and each column of data line and each column of pixel groups are alternately arranged in the row direction, each column of data line is coupled to respective sub-pixels located in the same column and corresponding to the same color, and each column of data line is coupled to two sub-pixels corresponding to the same color in two pixel groups located on adjacent two sides of the data line in the row direction.

In an exemplary embodiment of the present disclosure, the array substrate further includes a plurality of scan line groups;

each scan line group includes two rows of scan lines, which are respectively a first scan line and a second scan line, and the first scan line and the second scan line in each scan line group are respectively located at opposite sides of each row of pixel groups in the column direction; and wherein, sub-pixels located in even-numbered columns are coupled to adjacent first scan lines, and sub-pixels located in odd-numbered columns are coupled to adjacent second scan lines.

In an exemplary embodiment of the present disclosure, each row of sub-pixels is divided into a plurality of pixel units arranged in sequence in the row direction, and each pixel unit includes a first sub-pixel, a second sub-pixel and a third sub-pixel arranged in sequence in the row direction;

colors corresponding to the first sub-pixel, the second sub-pixel and the third sub-pixel are all different.

In an exemplary embodiment of the present disclosure, the sub-pixel includes a pixel electrode and a transistor; wherein, a gate of the transistor is a part of a structure of the scan line;

a first electrode of the transistor is arranged on the same layer as the data line and coupled to the data line;

a second electrode of the transistor is arranged on the same layer as the data line, and a part of the second electrode of the transistor is in contact with the pixel electrode.

In an exemplary embodiment of the present disclosure, the scan line includes a plurality of scan segments that are sequentially arranged and connected in the row direction; each scan segment includes a first portion, a transition connection portion and a second portion that are sequentially arranged and connected in the row direction; widths of the first portion and the second portion are greater than that of the transition connection portion; and the first portion, the transition connection portion and the second portion form a recess structure;

an orthographic projection of an active layer of the transistor on the first substrate is located within an orthographic projection of the first portion on the first substrate, and the gate of the transistor is constituted by a part of the first portion;

the second electrode of the transistor includes a first contact portion in contact with the pixel electrode, a second contact portion in contact with the active layer, and an electrode connection portion coupling the first contact portion and the second contact portion; and an orthographic projection of the electrode connection portion of the second electrode on the first substrate is overlapped with orthographic projections of the first portion, the second portion and the recess structure on the first substrate, and is not overlapped with an orthographic projection of the transition connection portion on the first substrate.

In an exemplary embodiment of the present disclosure, in each of the scan line groups:

a first portion of the first scan line is aligned to a second portion of the second scan line in the column direction, and a second portion of the first scan line is aligned to a first portion of the second scan line in the column direction; and a notch orientation of the recess structure of the first scan line is opposite to a notch orientation of the second scan line.

In an exemplary embodiment of the present disclosure, the sub-pixel further includes a common electrode, and the common electrode is located on a side of the pixel electrode away from the first substrate and is insulated from the pixel electrode; and an orthographic projection of the common electrode on the first substrate is overlapped with an orthographic projection of the pixel electrode on the first substrate.

In an exemplary embodiment of the present disclosure, the common electrode includes a first edge conductive portion and a second edge conductive portion that are opposite and spaced in the column direction, and a plurality of first electrode strips located between the first edge conductive portion and the second edge conductive portion and spaced in the column direction; the common electrode further includes a first conductive connection strip extending in the column direction, and the first conductive connection strip is located on the same side of the first edge conductive portion, the second edge conductive portion and the plurality of first electrode strips in the row direction, and is coupled to the first edge conductive portion, the second edge conductive portion and the plurality of first electrode strips; and in the common electrode, a gap between the first electrode strip and the first edge conductive portion, a gap between two adjacent first electrode strips, and a gap between the first electrode strip and the second edge conductive portion are all first gaps, an extension direction of the first gap is the same as that of the first electrode strip, and an extension direction of the first electrode strip is intersected with both the row direction and the column direction.

In an exemplary embodiment of the present disclosure, in the common electrode, an end of the first gap away from the first conductive connection strip is open-shaped.

In an exemplary embodiment of the present disclosure,
the common electrode has a first group and a second group arranged in the column direction, and the first group includes a plurality of first electrode strips spaced in the column direction and a first edge conductive portion on a side of the plurality of first electrode strips away from the second group; and the second group includes a plurality of second electrode strips spaced in the column direction and a second edge conductive portion on a side of the plurality of second electrode strips away from the first group;

the common electrode further has a first conductive connection strip extending in the column direction, the first conductive connection strip is located on the same side of the first group and the second group in the row direction, and is coupled to the first edge conductive portion, each first electrode strip, each second electrode strip and the second edge conductive portion; and in the common electrode, a gap between the first electrode strip and the first edge conductive portion and a gap between two adjacent first electrode strips are both first gaps, and a gap between the second electrode strip and the second edge conductive portion and a gap between two adjacent second electrode strips are both second gaps, and an extension direction of the first gap is the same as that of the first electrode strip and is intersected with both the row direction and the column direction; an extension direction of the second gap is the same as that of the second electrode strip and is intersected with both the row direction and the column direction, and the extension direction of the first electrode strip is intersected with the extension direction of the second electrode strip.

In an exemplary embodiment of the present disclosure, the common electrode further has a second conductive connection strip and a conductive adjustment portion coupled to the second conductive connection strip, and the second conductive connection strip extends in the column direction, and the conductive adjustment portion is located on a side of the second conductive connection strip close to the first conductive connection strip and between the first group and the second group;

ends of a first electrode strip in the first group close to the second group and a second electrode strip in the second group close to the first group away from the first conductive connection strip are both coupled to the second conductive connection strip;

a gap formed between the conductive adjustment portion and the first electrode strip is a third gap, and an extension direction of the third gap is the same as that of the first gap; and a gap formed between the conductive adjustment portion and the second electrode strip is a fourth gap, and an extension direction of the fourth gap is the same as that of the second gap.

In an exemplary embodiment of the present disclosure, a width of the first electrode strip is equal to a width of the second electrode strip, and widths of the first gap, the second gap, the third gap and the fourth gap are all equal.

In an exemplary embodiment of the present disclosure, ends of the first gap and the second gap away from the first conductive connection strip are open-shaped.

In an exemplary embodiment of the present disclosure, the common electrode is an integrated structure, and the common electrode is arranged in mirror symmetry with respect to the row direction.

In an exemplary embodiment of the present disclosure, in the pixel group, common electrodes of the two sub-pixels are arranged in mirror symmetry with respect to the column direction, and share the first conductive connection strip to form an electrode mirrored unit.

In an exemplary embodiment of the present disclosure, the array substrate further includes a plurality of common line groups, and each common line group is located between the first scan line and the second scan line of one of the scan line groups; and each common line group includes two rows of common lines arranged on the same layer as the scan lines, which are respectively a first common line and a second common line, and the first common line and the second common line in each common line group are respectively located on opposite sides of each row of the pixel groups in the column direction;

an orthographic projection of the first edge conductive portion of the electrode mirrored unit on the first substrate is overlapped with an orthographic projection of the first common line on the first substrate, and is coupled to the first common line through a first transferring via hole; and an orthographic projection of the second edge conductive portion of the electrode mirrored unit on the first substrate is overlapped with an orthographic projection of the second common line on the first substrate, and is coupled to the second common line through a second transferring via hole.

In an exemplary embodiment of the present disclosure,
an orthographic projection of at least part of the first transferring via hole on the first substrate is overlapped with an orthographic projection of the first common line on the first substrate; and
an orthographic projection of at least part of the second transferring via hole on the first substrate is overlapped with an orthographic projection of the second common line on the first substrate.

In an exemplary embodiment of the present disclosure, each common line group further includes a plurality of common connection lines spaced in the row direction and located between the first common line and the second common line, and the common connection line extends in the column direction and is arranged on the same layer as the scan line, and two ends of the common connection line are respectively coupled to the first common line and the second common line; and an orthographic projection of the first conductive connection strip of each electrode mirrored unit on the first substrate is located within an orthographic projection of a common connection line on the first substrate.

In an exemplary embodiment of the present disclosure, a jumper wire is also disposed between two adjacent electrode mirrored units in the column direction; and the jumper wire is arranged on the same layer as the electrode mirrored unit, and is coupled to two adjacent electrode mirrored units in the column direction.

In an exemplary embodiment of the present disclosure, the jumper wire has a first connection portion, an intermediate connection portion and a second connection portion which are sequentially arranged and connected in the column direction, and widths of the first connection portion and the second connection portion are greater than a width of the intermediate connection portion; and an intermediate region of an edge of one of two adjacent electrode mirrored units in the column direction is coupled to the first connection portion, and an intermediate region of an edge of the other of the two adjacent electrode mirrored units is coupled to the second connection portion.

In an exemplary embodiment of the present disclosure, an orthographic projection of the first connection portion on the first substrate is at least partially overlapped with an orthographic projection of the first transferring via hole on the first substrate; and an orthographic projection of the second connection portion on the first substrate is at least partially overlapped with an orthographic projection of the second transferring via hole on the first substrate.

In an exemplary embodiment of the present disclosure, the data line has an alignment portion configured to be aligned with a spacer, and an orthographic projection of the alignment portion on the first substrate is located between two adjacent rows of the pixel groups; and widths of other portions of the data line except the alignment portion are smaller than a width of the alignment portion; and an orthographic projection of a surface of the spacer close to the array substrate on the first substrate is located within an orthographic projection of the alignment portion on the first substrate.

In an exemplary embodiment of the present disclosure, the orthographic projection of the alignment portion on the first substrate is located between orthographic projections of the first scan line of one of two adjacent scan line groups and the second scan line of the other of the two adjacent scan line groups on the first substrate.

A second aspect of the present disclosure provides a display device, which includes any array substrate described above and a opposite substrate arranged in cell alignment with the array substrate.

Other features and advantages of the present disclosure will become apparent from the following detailed description, or be learned in part by practice of the present disclosure.

It should be noted that the above general description and the following detailed description are merely exemplary and explanatory and should not be construed as limiting of the disclosure.

BRIEF DESCRIPTION OF THE DRAWINGS

The drawings here are incorporated into the specification and constitute a part of the specification, show embodiments in accordance with the present disclosure, and are used together with the specification to explain the principle of the present disclosure. Obviously, the drawings in the following description are only some embodiments of the present disclosure. For those of ordinary skill in the art, other drawings can be obtained based on these drawings without creative work.

DETAILED DESCRIPTION

Figure 1:
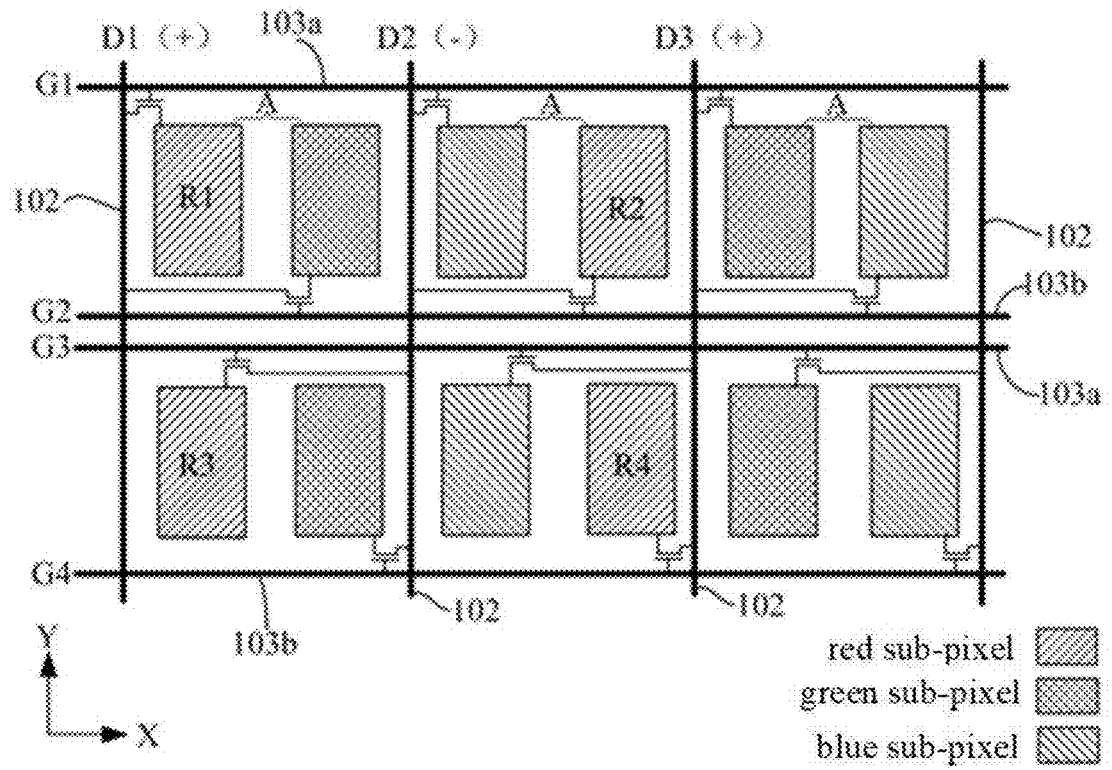
FIG. 1 shows a schematic structural diagram of an array substrate according to an embodiment of the present disclosure.

Exemplary embodiments will now be described more fully with reference to the accompanying drawings. However, the exemplary embodiments can be implemented in a variety of forms and should not be construed as being limited to the examples set forth herein; rather, these embodiments are provided so that the present disclosure will be more full and complete so as to convey the idea of the exemplary embodiments to those skilled in this art. The same reference numerals in the drawings denote the same or similar parts, and the repeated description thereof will be omitted.

Although the relative terms such as "above" and "below" are used in the specification to describe the relative relationship of one component to another component shown, these terms are only for convenience in this specification, for example, according to an exemplary direction shown in the drawings. It will be understood that if the device shown is flipped upside down, the component described as "above" will become a component "below" another component. When a structure is "on" another structure, it may mean that a structure is integrally formed on another structure, or that a structure is "directly" disposed on another structure, or that a structure is "indirectly" disposed on another structure through other structures.

The terms "one", "a", "the", "said", and "at least one" are used to indicate that there are one or more elements/components or the like; the terms "include" and "have" are used to indicate an open meaning of including and means that there may be additional elements/components/etc. in addition to the listed elements/components/etc.

A resolution of a conventional 8K display panel is 7680× 4320, that is, it has 7680 columns of pixel units and 4320 rows of pixel units, and each pixel unit includes three sub-pixels.

In the 8K display panel, for a single-gate (i.e., each row of pixel units is driven by one row of scan line) pixel architecture, each column of sub-pixels is provided with one data line, that is to say, the entire 8K display panel requires a total of 7680×3 (23040) data lines. Taking each data driving integrated circuit (IC) driving 960 data lines as an example, driving an 8K resolution display panel requires 24 data driving ICs.

It should be noted that the data driving IC mentioned in the present disclosure can be fixed on a flexible circuit board, that is, the data driving IC can also be called Chip On Film (COF), but not limited to this, the data driving IC can also be directly integrated on the array substrate.

In the 8K display panel, for a dual-gate (i.e., each row of pixel units is driven by two rows of scan lines) pixel architecture, every two adjacent columns of sub-pixels are provided with one data line. Compared to the aforementioned single-gate pixel architecture, the number of COFs for driving the data lines can be reduced by half, that is, to 12 COFs, which can greatly reduce the manufacturing cost of the panel.

Based on the above, in the 8K display panel, the number of scan lines in the single-gate pixel architecture is 4320 lines. Taking a frame rate of 60 Hz as an example, a charging time of each row of pixel units is 3.7 us; for the dual-gate pixel architecture, the halving of the number of data lines is based on the premise of doubling the number of scan lines. The number of scan lines is 4320×2 (total 8640). At the frame rate of 60 Hz, the charging time of each row of pixels is reduced to 1.85 us, that is to say, compared to a charging rate of the pixels in the single-gate pixel architecture, a charging rate of the pixels in the dual-gate pixel architecture is greatly reduced, resulting in the occurrence of more picture quality problems.

FIG. 1 shows an array substrate with a double-gate pixel architecture mentioned according to an embodiment of the present disclosure. As shown in FIG. 1, the array substrate may include a plurality of pixel units arranged in an array in a row direction X and a column direction Y, and each pixel unit includes a red sub-pixel, a green sub-pixel and a blue sub-pixel arranged in the row direction X. For the convenience of the following description, each row of pixel units can be divided into a plurality of pixel groups A arranged in sequence in the row direction X, and each pixel group A includes two adjacent sub-pixels in the row direction X. For example, two adjacent pixel units in the row direction X can be divided into three pixel groups. It should be noted that the red sub-pixel refers to a sub-pixel corresponding to a red filter block, the green sub-pixel refers to a sub-pixel corresponding to a green filter block, and the blue sub-pixel refers to a sub-pixel corresponding to a blue filter block.

As shown in FIG. 1, the array substrate may further include a plurality of columns of data lines 102 and a plurality of scan line groups. Each column of data line 102 and each column of pixel groups A are alternately arranged in the row direction X; and two sub-pixels of each pixel group A are coupled to the same column of data line 102, and two adjacent pixel groups A in the column direction Y are respectively coupled to different columns of data lines 102. Each scan line group corresponds to one row of pixel groups A, specifically, each scan line group may include two rows of scan lines, which are a first scan line 103a and a second scan line 103b, respectively, and the first scan line 103a and the second scan line 103b are respectively located on opposite sides of one row of pixel groups in the column direction Y. The first scan line 103a in each scan line group is coupled to sub-pixels of one row of pixel groups A located in odd-numbered columns, and the second scan line 103b in each scan line group is coupled to sub-pixels of this row of pixel groups A located in even-numbered columns.

Based on the array substrate shown in FIG. 1, during an picture quality test, for example, during the picture quality test of monochromatic red, monochromatic green, monochromatic blue, red-green mixed, blue-green-red mixed, and red-blue mixed, some sub-pixels are pre-charged, resulting in a long charging time, and some sub-pixels are not pre-charged, resulting in a short charging time, which is prone to the problem of horizontal stripes or vertical stripes.

Figure 2:
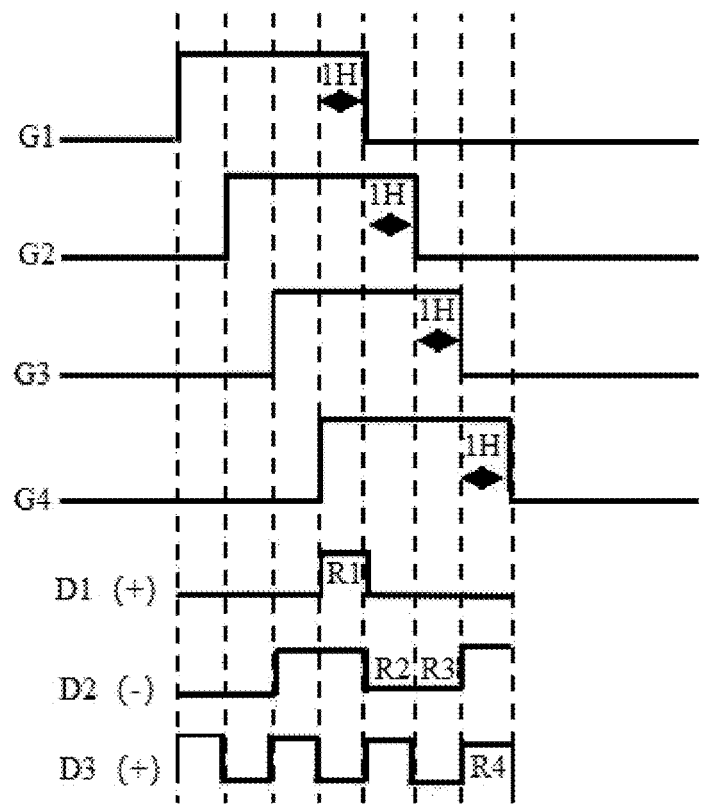
FIG. 2 shows a timing diagram of the array substrate shown in FIG. 1.

Taking display of a monochrome red screen as an example, a high level of each row of scan line may last for 4 H. It should be noted that 4 H is used as an example in this disclosure, and 2 H/3 H/4 H/5 H/6 H/7 H/8 H are actually applicable techniques of the present disclosure. As shown in FIG. 1 and FIG. 2, gate signals corresponding to the red sub-pixels R1/R2/R3/R4 are respectively G1/G2/G3/G4, and the last 1 H time of the high level of 4 H time of the gate signals G1/G2/G3/G4 is an actual data charging time of the red sub-pixels R1/R2/R3/R4, and the first 3 H time is a pre-charging time. D1 is a data signal of the sub-pixel R1, D2 is a data signal of the sub-pixel R1/R2, and D3 is a data signal of R4; it should be noted that data signals D1/D3 in FIG. 1 and FIG. 2 are positive data signals, that is, D1(+)/D3(+); and the data signal D2 is a negative data signal, that is, D2(−).

For the three red sub-pixels R1/R2/R4, a level of the data line is inconsistent with a charging level of the red sub-pixels within the first H time when they are charged, as a result, the pre-charging cannot be achieved, that is, the actual charging time of each red sub-pixel is 1 H (1 H=1.85 us in a display product of 8K 60 Hz dual-gate pixel architecture), and considering the delay of the signal line, the actual charging time is shorter than 1.85 us; for the red sub-pixel R3, within the first H time when it is charged, the data signal is data of the red sub-pixel R2, and the red sub-pixel R3 and the red sub-pixel R2 need to be charged with the same data, which is equivalent to that the charging time of the red sub-pixel R3 is 2 H, which will cause a higher charging rate of the red sub-pixel R3 than the charging rate of the red sub-pixels R1/R2/R4, and the occurrence of the phenomenon of uneven picture brightness.

In order to solve the aforementioned technical problems, embodiments of the present disclosure provides an array substrate, which can be used in liquid crystal display products, but is not limited thereto, depending on specific situations.

Figure 3:
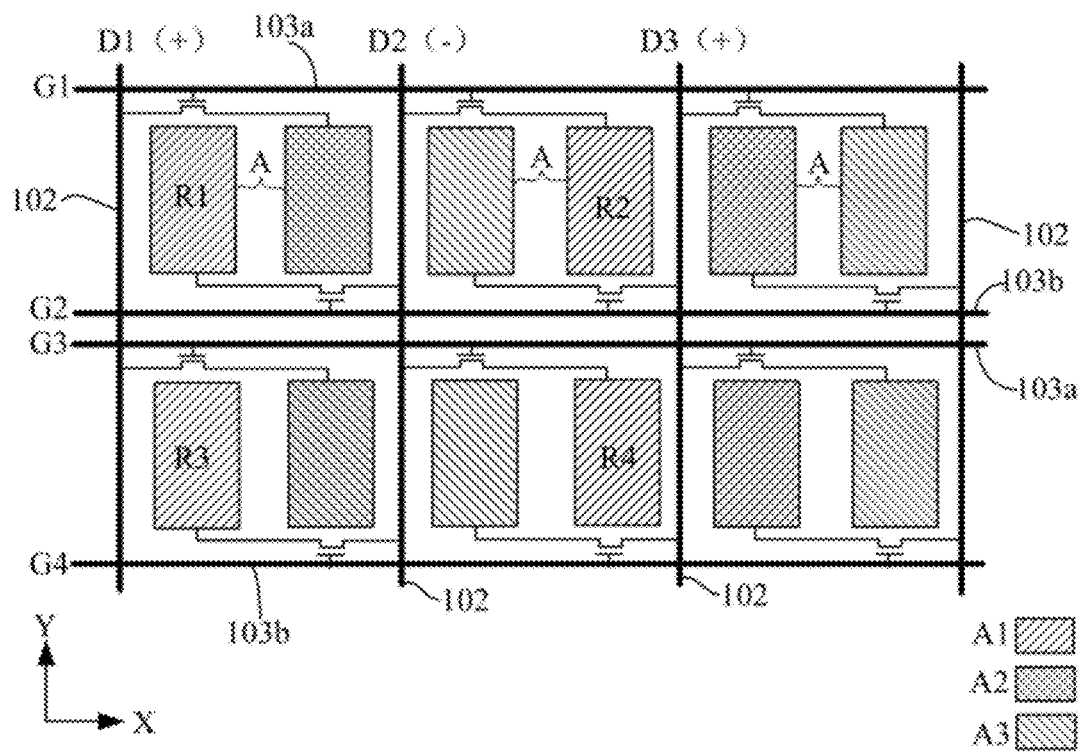
FIG. 3 shows a schematic structural diagram of an array substrate according to an embodiment of the present disclosure.

As shown in FIG. 3, an array substrate 10 of the embodiments of the present disclosure may include a first substrate (not shown in FIG. 3), and a plurality of pixel groups A and a plurality of columns of data lines 102 formed on the first substrate. The plurality of pixel groups A are arranged in an array along the row direction X and the column direction Y, and each pixel group A includes two sub-pixels arranged in the row direction X; at least one sub-pixel of one of any two adjacent pixel groups A in the row direction X corresponds to the same color as one sub-pixel of the other pixel group; and any two adjacent sub-pixels in the row direction X correspond to different colors; and each column of data line 102 and each column of pixel groups A are alternately arranged in the row direction X, each column of data line 102 is coupled to respective sub-pixels located in the same column and corresponding to the same color, and each column of data line 102 is coupled to two sub-pixels corresponding to the same color in two pixel groups A located on adjacent two sides of the data line in the row direction X.

In addition, the array substrate 10 may further include a plurality of scan line groups, and each scan line group includes two rows of scan lines, which are respectively a first scan line 103a and a second scan line 103b, and the first scan line 103a and the second scan line 103b in each scan line group are respectively located at opposite sides of each row of pixel groups A in the column direction Y. Sub-pixels located in even-numbered columns are coupled to adjacent first scan lines 103a, and sub-pixels located in odd-numbered columns are coupled to adjacent second scan lines 103b.

It should be noted that the first scan line 103a and the second scan line 103b are arranged on the same layer, and can be located on a side of the data line 102 close to the first substrate; it should be understood that an insulating layer is disposed between the first scan line 103a and the second scan line 103b and the data line 102.

In the present disclosure, "arranged on the same layer" means that the same film forming process is used to form a film layer for forming a specific pattern, and then a layer structure is formed by using the same mask through one patterning process. That is, one patterning process corresponds to one mask (also called photomask). Depending on different particular patterns, one patterning process may include multiple exposure, development or etching processes, and the particular patterns in the formed layer structure may be continuous or discontinuous, and these particular patterns may also be at different heights or have different thicknesses. Thus, the manufacturing process is simplified, the manufacturing cost is saved, and the manufacturing efficiency is improved.

In the embodiments of the present disclosure, each row of sub-pixels is divided into a plurality of pixel units arranged in sequence in the row direction X, and each pixel unit includes a first sub-pixel A1, a second sub-pixel A2 and a third sub-pixel A3 arranged in sequence in the row direction, colors corresponding to the first sub-pixel A1, the second sub-pixel A2 and the third sub-pixel A3 are all different. For example, the first sub-pixel A1 can be a red sub-pixel, the second sub-pixel A2 may be a green sub-pixel, and the third sub-pixel A3 may be a blue sub-pixel, but not limited thereto, the first sub-pixel A1, the second sub-pixel A2 and the third sub-pixel A3 may also be other colors, on a case-by-case basis.

Figure 4:
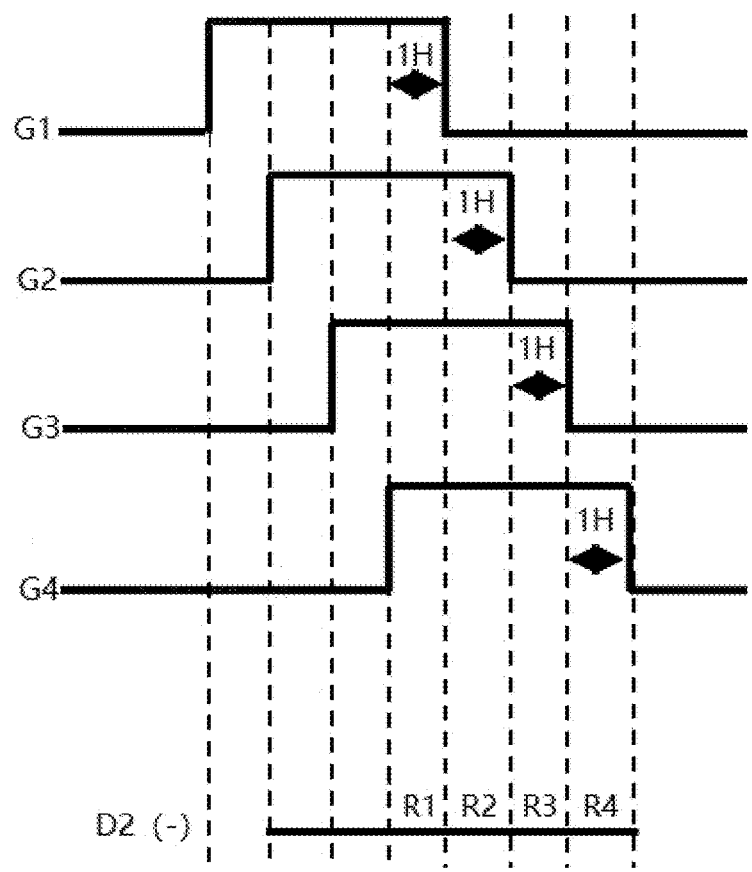
FIG. 4 shows a timing diagram of the array substrate shown in FIG. 3.

Based on the array substrate of the aforementioned embodiments of the present disclosure, all sub-pixels coupled to each column of data line 102 are of the same color. As shown in FIG. 3, sub-pixels driven by data lines 102 corresponding to a data signal D1 are all green sub-pixels, sub-pixels driven by data lines 102 corresponding to a data signal D2 are all red sub-pixels, and sub-pixels driven by data lines 102 corresponding to a data signal D3 are all blue sub-pixels. It should be noted that data signals D1/D3 in FIG. 3 and FIG. 4 are positive data signals, that is, D1(+)/D3(+); and the data signal D2 is a negative data signal, that is, D2(−). As shown in FIG. 3, each column of data line 102 does not drive sub-pixels adjacent to it, but drives sub-pixels spaced apart it by one sub-pixel.

In the embodiments of the present disclosure, taking the display of the monochrome red screen as an example, a high level of each row of scan line may last for 4 H, and 4 H is used as an example in this disclosure, and 2 H/3 H/4 H/5 H/6 H/7 H/8 H are actually applicable techniques of the present disclosure. As shown in FIG. 3 and FIG. 4, gate signals corresponding to the red sub-pixels R1/R2/R3/R4 are respectively G1/G2/G3/G4, and the last 1 H time of the high level of 4 H time of the gate signals G1/G2/G3/G4 is an actual data charging time of the red sub-pixels R1/R2/R3/R4, and the first 3 H time is a pre-charging time. In the pixel architecture provided by the present disclosure, when the monochrome red screen is displayed, data of the data lines 102 within one frame is the same, so the actual charging time of each sub-pixel is 4 H, and the actual charging time of all red sub-pixels is 4 H, so that not only the picture quality is more uniform, but also the overall brightness of the picture is improved due to the longer actual charging time of the sub-pixels; especially in 8K dual-gate pixel architecture products, the pixel charging rate is relatively low, and this pixel architecture has a significant improvement effect on the picture quality, since the sub-pixels coupled to each column of data line 102 in this pixel architecture are of the same color, gates of every two rows of sub-pixels can be turned on at the same time, and the pixel charging time is doubled, thereby increasing the pixel charging rate of each row of sub-pixels.

A structure of the array substrate according to the embodiments of the present disclosure will be described in detail below with reference to the drawings.

Figure 6:
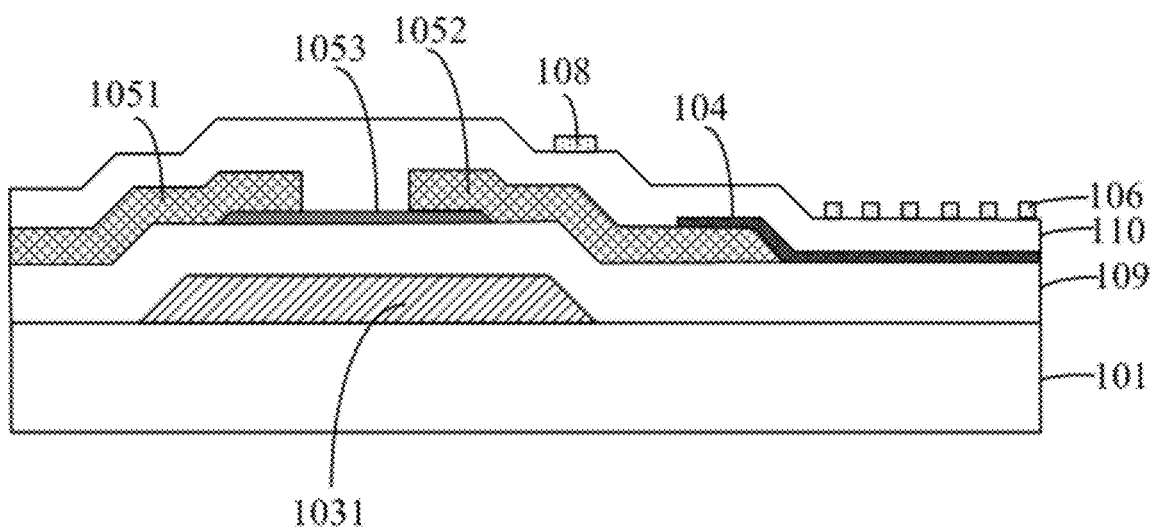
FIG. 6 shows a schematic cross-sectional structure diagram of an array substrate according to an embodiment of the present disclosure.

As shown in FIG. 6, the first substrate 101 may have a single-layer structure, but is not limited thereto, and the first substrate 101 may also include a multi-layer structure. For example, a material of the first substrate 101 can be glass, but not limited thereto, the material of the first substrate 101 can also be other materials, such as polyimide (PI) and other materials, depending on a specific situation.

Figure 5:
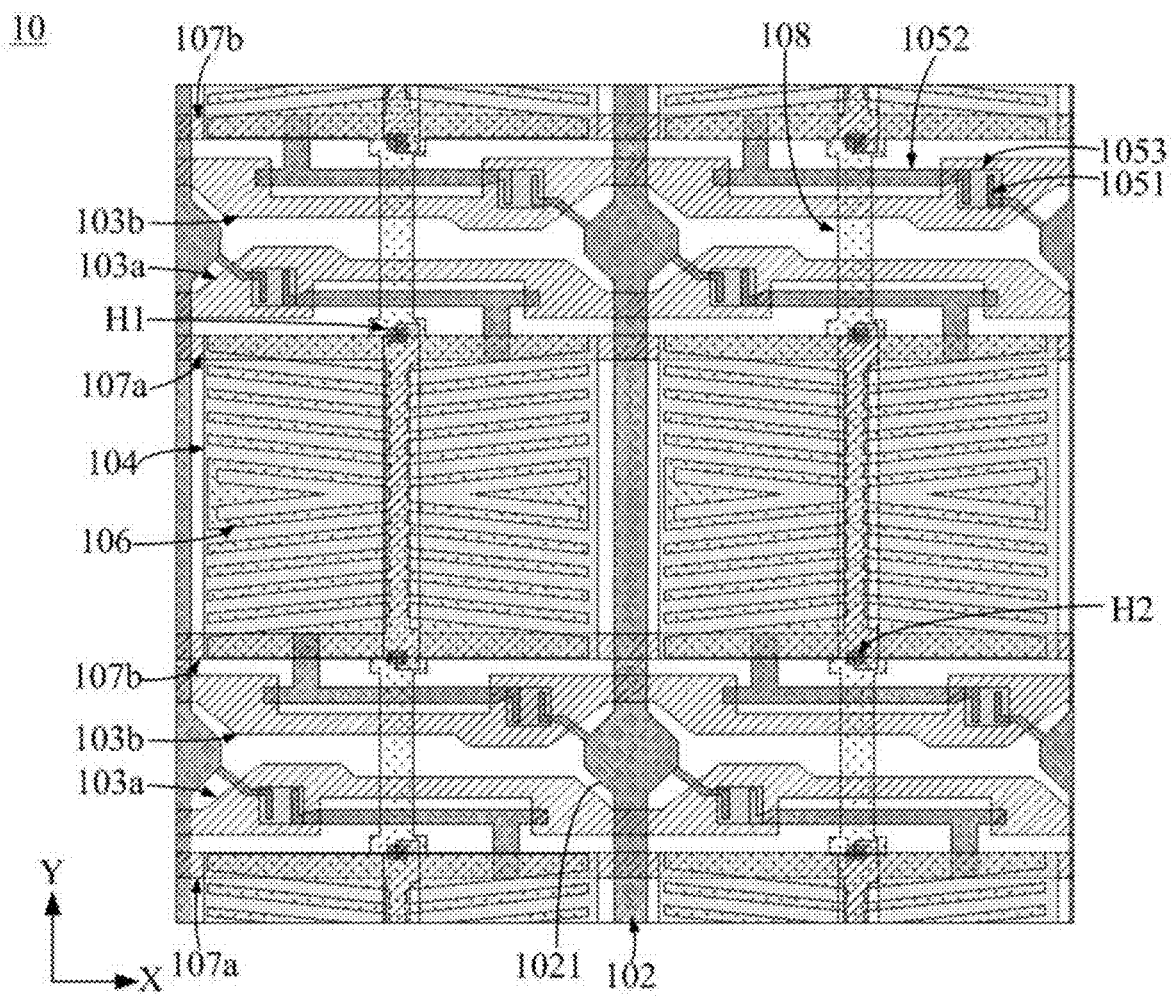
FIG. 5 shows a schematic structural diagram of stacked film layers in an array substrate according to an embodiment of the present disclosure.
Figure 7:
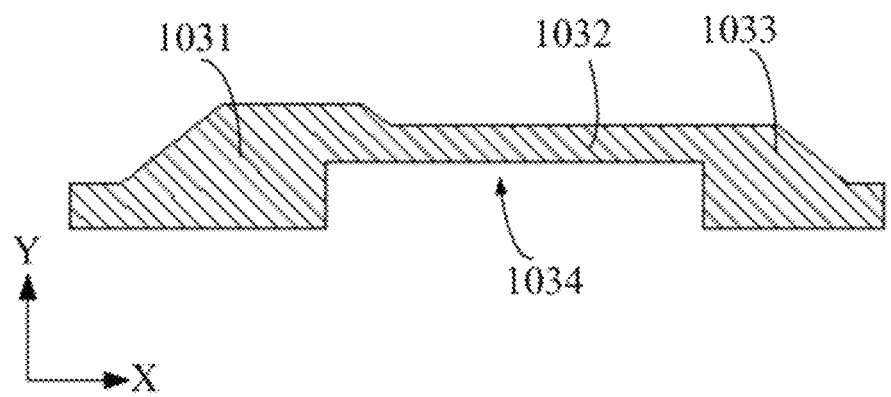
FIG. 7 shows a schematic structural diagram of a scan segment of a scan line in the array substrate shown in FIG. 5.

As shown in FIG. 5 and FIG. 7, the scan line 103a or 103b includes a plurality of scan segments that are sequentially arranged and connected in the row direction X; each scan segment includes a first portion 1031, a transition connection portion 1032 and a second portion 1033 that are sequentially arranged and connected in the row direction X; widths of the first portion 1031 and the second portion 1033 are greater than that of the transition connection portion 1032; and the first portion 1031, the transition connection portion 1032 and the second portion 1033 form a recess structure 1034.

It should be noted that, a width of a structure mentioned in the present disclosure is a dimension in a direction perpendicular to an extension direction of the structure.

As shown in FIG. 5 and FIG. 7, in each scan line group: the first portion 1031 of the first scan line 103a is aligned to the second portion 1033 of the second scan line 103b in the column direction Y, and the second portion 1033 of the first scan line 103a is aligned to the first portion 1031 of the second scan line 103b in the column direction Y; and a notch orientation of the recess structure 1034 of the first scan line 103a is opposite to a notch orientation of the second scan line 103b. It should be understood that the notch of the recess structure 1034 is an opening of the recess structure 1034 opposite to the transition connection portion 1032 in the column direction Y.

In the embodiments of the present disclosure, as shown in FIG. 5 and FIG. 6, the sub-pixel may include a pixel electrode 104, a transistor and a common electrode 106.

The transistor may include an active layer 1053, a gate, and a first electrode 1051 and a second electrode 1052 arranged on the same layer. For example, the first electrode 1051 and the second electrode 1052 may be arranged on the same layer as the data line 102. A gate insulating layer 109 can also be arranged between the gate and the active layer 1053 of the transistor to insulate the gate and the active layer 1053 from each other. The gate insulating layer 109 can be made of an inorganic material, for example, silicon oxide and silicon nitride. It should be noted that the gate can be arranged on the same layer as the aforementioned first scan line 103a and second scan line 103b, and the gate can be a part of the aforementioned first scan line 103a or second scan line 103b. That is, a partial structure of the first scan line 103a or the second scan line 103b can be used as the gate of the transistor. The first electrode 1051 and the second electrode 1052 may be respectively coupled to the two doped regions (i.e., a source doped region and a drain doped region) of the active layer 1053, and the first electrode 1051 and the second electrode 1052 may include metal materials or alloy materials, such as a metal monolayer or multi-layer structure formed of molybdenum, aluminum and titanium, etc., for example, the multi-layer structure is a multi-metal stack, such as titanium, aluminum, titanium three-layer metal stack (Ti/Al/Ti).

For example, the transistor of the embodiments of the present disclosure may be a bottom-gate type, that is, the gate may be firstly formed on the first substrate 101, and the gate may include the metal material or the alloy material, such as molybdenum, aluminum and titanium etc. to ensure its good electrical conductivity; the gate insulating layer 109 is then formed on the first substrate 101, as shown in FIG. 6, the gate insulating layer 109 covers the gate; and the active layer 1053 is formed on a side of the active layer 1053 away from the first substrate 101, that is, the active layer 1053 is located on a side of the gate away from the first substrate 101. An orthographic projection of the active layer 1053 on the first substrate 101 overlaps with an orthographic projection of the gate on the first substrate 101, for example, the orthographic projection of the active layer 1053 on the first substrate 101 may be located within the orthographic projection of the gate on the first substrate. The first electrode 1051 and the second electrode 1052 may be formed after the active layer 1053 is formed, and an end of the first electrode 1051 can be located on a side of the active layer 1053 away from the first substrate 101 and in contact with the source doped region of the active layer 1053, and the other end of the first electrode 1051 is coupled to the data line 40. One end of the second electrode 1052 may be located on the side of the active layer 1053 away from the first substrate 101 and in contact with the active layer 1053, and the other end of the second electrode 1052 may be coupled to the pixel electrode 104.

It should be noted that the contact mentioned in the embodiments of the present disclosure means that two components are directly attached together without other film layers between them, that is, the connection of the two components does not require any other structure (for example, a transferring via hole). In addition, it should also be noted that the transistor in the embodiments of the present disclosure are not limited to the bottom-gate type transistor mentioned above, and may also be a top-gate type transistor.

Based on the structure of the scan line mentioned above, as shown in FIG. 5 to FIG. 7, an orthographic projection of the active layer 1053 of the transistor on the first substrate 101 may be located within an orthographic projection of the first portion 1031 of the scan line on the first substrate, and the gate of the transistor may be constituted by a part of the first portion 1031 of the scan line.

Figure 8:
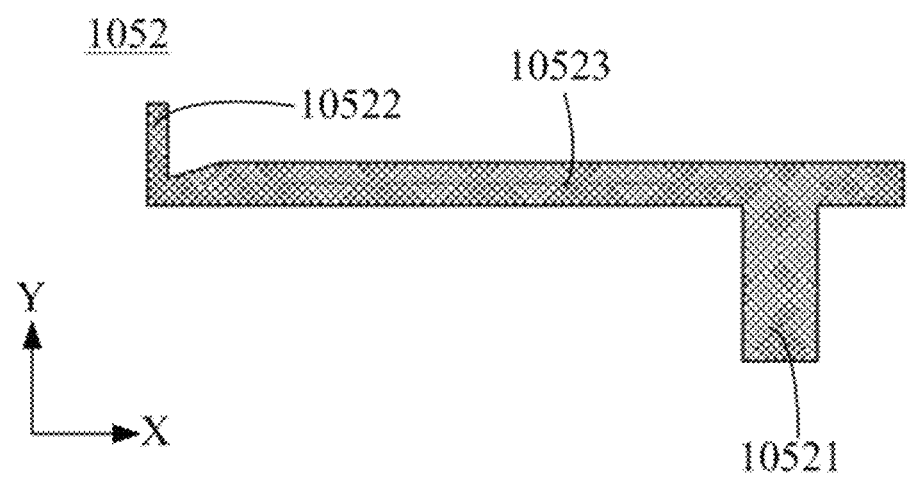
FIG. 8 shows a schematic structural diagram of a second electrode of a transistor in the array substrate shown in FIG. 5.

In addition, as shown in FIG. 5, FIG. 7 and FIG. 8, the second electrode 1052 of the transistor may include a first contact portion 10521 coupled to the pixel electrode 104, a second contact portion 10522 coupled to the active layer 1053 and an electrode connection portion 10523 coupling the first contact portion 10521 and the second contact portion 10522. An orthographic projection of the electrode connection portion 10523 of the second electrode 1052 on the first substrate 101 overlaps with orthographic projections of the first portion 1031, the second portion 1033 and the recess structure 1034 on the first substrate 101, and does not overlap with an orthographic projection of the transition connection portion 1032 on the first substrate 101.

In the embodiments of the present disclosure, the second electrode 1052 of the transistor and the scan line are designed as above, so that the second electrode 1052 of the transistor and the gate can be accurately aligned, that is, misalignment of the second electrode 1052 of the transistor and the gate can be avoided, thereby preventing the parasitic capacitance of two adjacent transistors in the row direction X (that is, the parasitic capacitance between the second electrode 1052 of the transistor and the gate) being different, thereby avoiding the problem of abnormal picture quality, etc.

In an embodiment of the present disclosure, as shown in FIG. 6, the pixel electrode 104 may be formed on the gate insulating layer 109 after the first electrode 1051 and the second electrode 1052 are formed. As shown in FIGS. 5 and 6, an orthographic projection of the pixel electrode 104 on the first substrate 101 does not overlap with the orthographic projection of the active layer 12 on the first substrate 101, and the orthographic projection of the pixel electrode 104 on the first substrate 101 overlaps with an orthographic projection of a part of the second electrode 1052 on the first substrate 101 and the second electrode 1052 is in contact with the pixel electrode 104. Specifically, the pixel electrode 104 can be in contact with a first contact portion 10521 of the second electrode 1052, that is to say, there is no other film layer between the pixel electrode 104 and the second electrode 1052, and they are directly attached together without the transferring via hole. In this way, compared with a scheme in which the pixel electrodes 104 and the second electrodes 1052 are coupled through the transferring via hole, while improving an aperture ratio of the product, it can also improve the insufficient design margin of other structures, and avoid the risk of undercut in the formation of the transferring via hole, improving display uniformity.

It should be noted that the pixel electrode 104 in the embodiments of the present disclosure is not limited to be formed on the gate insulating layer 109 after the first electrode 1051 and the second electrode 1052 are formed, and the pixel electrode 104 can also be formed on the gate insulating layer 109 after the formation of the active layer 1053 and before the formation of the first electrode 1051 and the second electrode 1052, as long as it is ensured that the pixel electrode 104 is in contact with a part of the second electrode 1052.

For example, a material of the pixel electrode 104 in the embodiments of the present disclosure is different from the material of the second electrode 1052 mentioned above. The pixel electrode 104 can be a transparent electrode, and the material of the pixel electrode 104 can be an indium tin oxide (ITO) material, but not limited to this, it can also be made of transparent materials such as indium zinc oxide (IZO) and zinc oxide (ZnO).

In the embodiments of the present disclosure, as shown in FIG. 5 and FIG. 6, a common electrode 106 may be located on a side of the pixel electrode 104 away from the first substrate 101 and insulated from the pixel electrode 104, that is, a passivation layer 110 may be disposed between the common electrode 106 and the pixel electrode 104, and an orthographic projection of the common electrode 106 on the first substrate 101 overlaps with the orthographic projection of the pixel electrode 104 on the first substrate 101, so that the storage capacitance can be improved. It should be understood that the passivation layer 110 mentioned here and the gate insulating layer 109 mentioned above are both film layers provided in the whole layer, which can cover each film layer structure under them, and the passivation layer 110 can be an inorganic film layer such as silicon nitride, but not limited thereto, may also be an organic film layer, etc., depending on the specific situation.

For example, a material of the common electrode 106 can be the same as the material of the pixel electrode 104, the common electrode 106 can be a transparent electrode, and the material of the common electrode 106 can be the indium tin oxide (ITO) material, but not limited to this, it can also be made of transparent materials such as indium zinc oxide (IZO) and zinc oxide (ZnO).

In the embodiments of the present disclosure, the pixel electrode 104 can be a plate-shaped electrode, that is, the pixel electrode 104 is not provided with a gap; and the common electrode 106 can be a slit electrode, that is, the common electrode 106 can be provided with the gap. Specifically, the common electrode 106 of the embodiments of the present disclosure may have the following design schemes:

First Scheme

Figure 9:
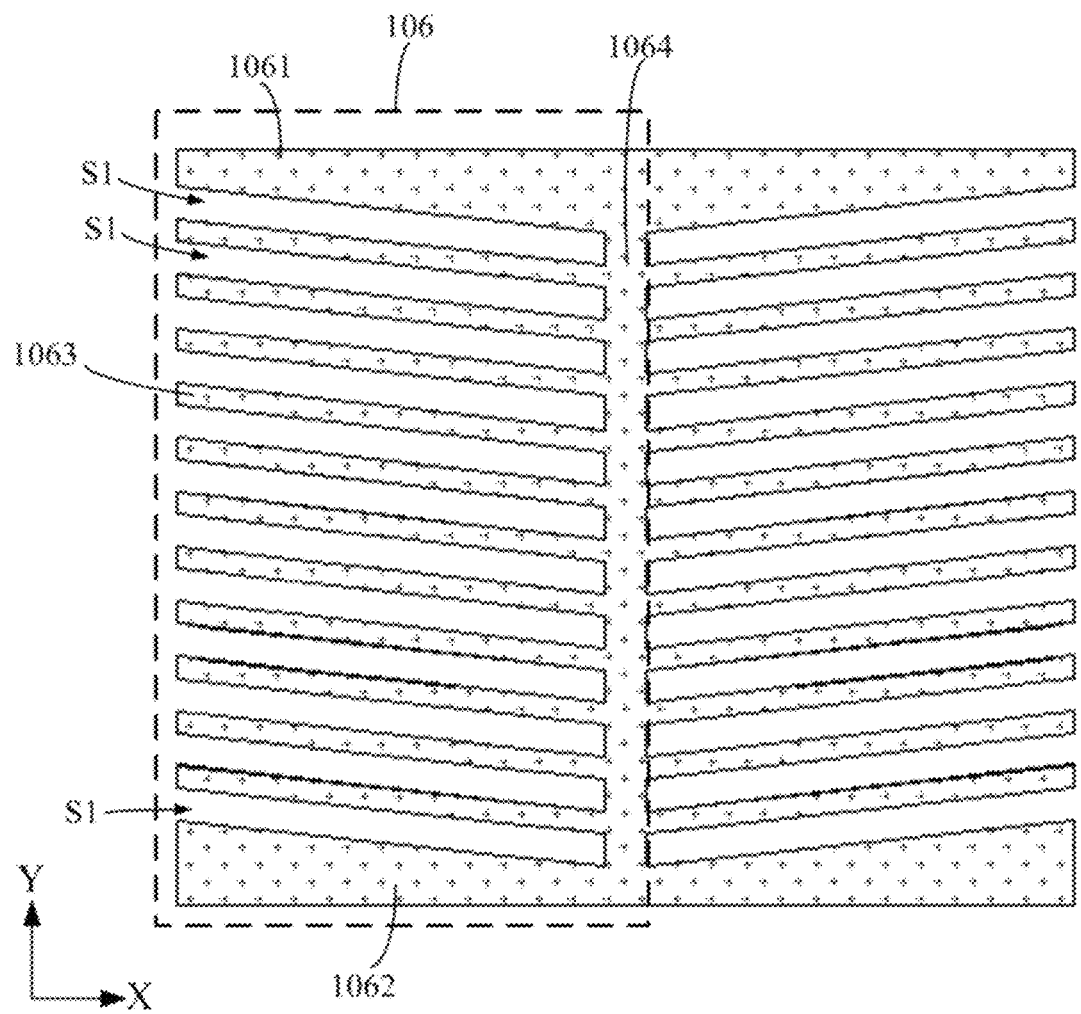
FIG. 9 shows a schematic structural diagram of an electrode mirrored unit in an array substrate according to an embodiment of the present disclosure.

The common electrode in this scheme is a single domain structure. Specifically, as shown in FIG. 9, the common electrode 106 may include a first edge conductive portion 1061 and a second edge conductive portion 1062 that are opposite and spaced in the column direction Y, and a plurality of first electrode strips 1063 located between the first edge conductive portion 1061 and the second edge conductive portion 1062 and spaced in the column direction Y The common electrode 106 further includes a first conductive connection strip 1064 extending in the column direction, and the first conductive connection strip 1064 is located on the same side of the first edge conductive portion 1061, the second edge conductive portion 1062 and the plurality of first electrode strips 1063 in the row direction X, and is coupled to the first edge conductive portion 1061, the second edge conductive portion 1062 and the plurality of first electrode strips 1063.

In the common electrode 106, a gap between the first electrode strip 1063 and the first edge conductive portion 1061, a gap between two adjacent first electrode strips 1063, and a gap between the first electrode strip 1063 and the second edge conductive portion 1062 are all first gaps 51, an extension direction of the first gap 51 is the same as that of the first electrode strip 1063 (i.e., a length direction), and an extension direction of the first electrode strip 1063 is intersected with both the row direction X and the column direction Y.

Optionally, in the common electrode 106, an end of the first gap 51 away from the first conductive connection strip 1064 is open-shaped, that is, a position of the common electrode 106 of each sub-pixel close to the data line 102 is designed with an opening. Compared with a scheme in which the gap is closed all around, a dark field region of the pixel can be reduced and the aperture ratio of the pixel can be improved.

Figure 10:
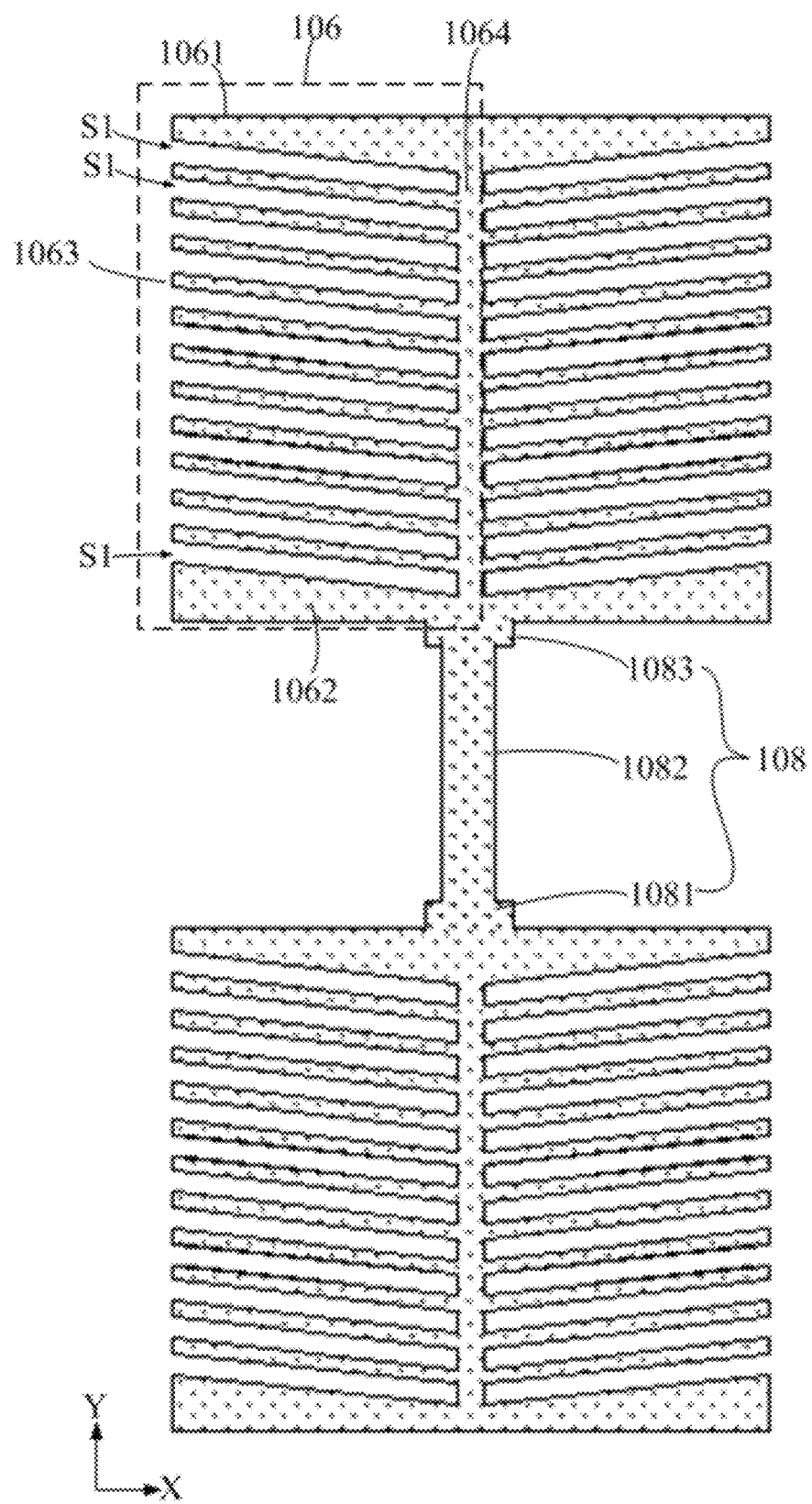
FIG. 10 shows a schematic diagram of arrangement of a plurality of electrode mirrored units according to an embodiment of the present disclosure.

In the embodiments of the present disclosure, as shown in FIG. 10, extension directions of the first electrode strips 1063 of two adjacent common electrodes in the column direction Y are parallel to each other.

Second Scheme

Figure 11:
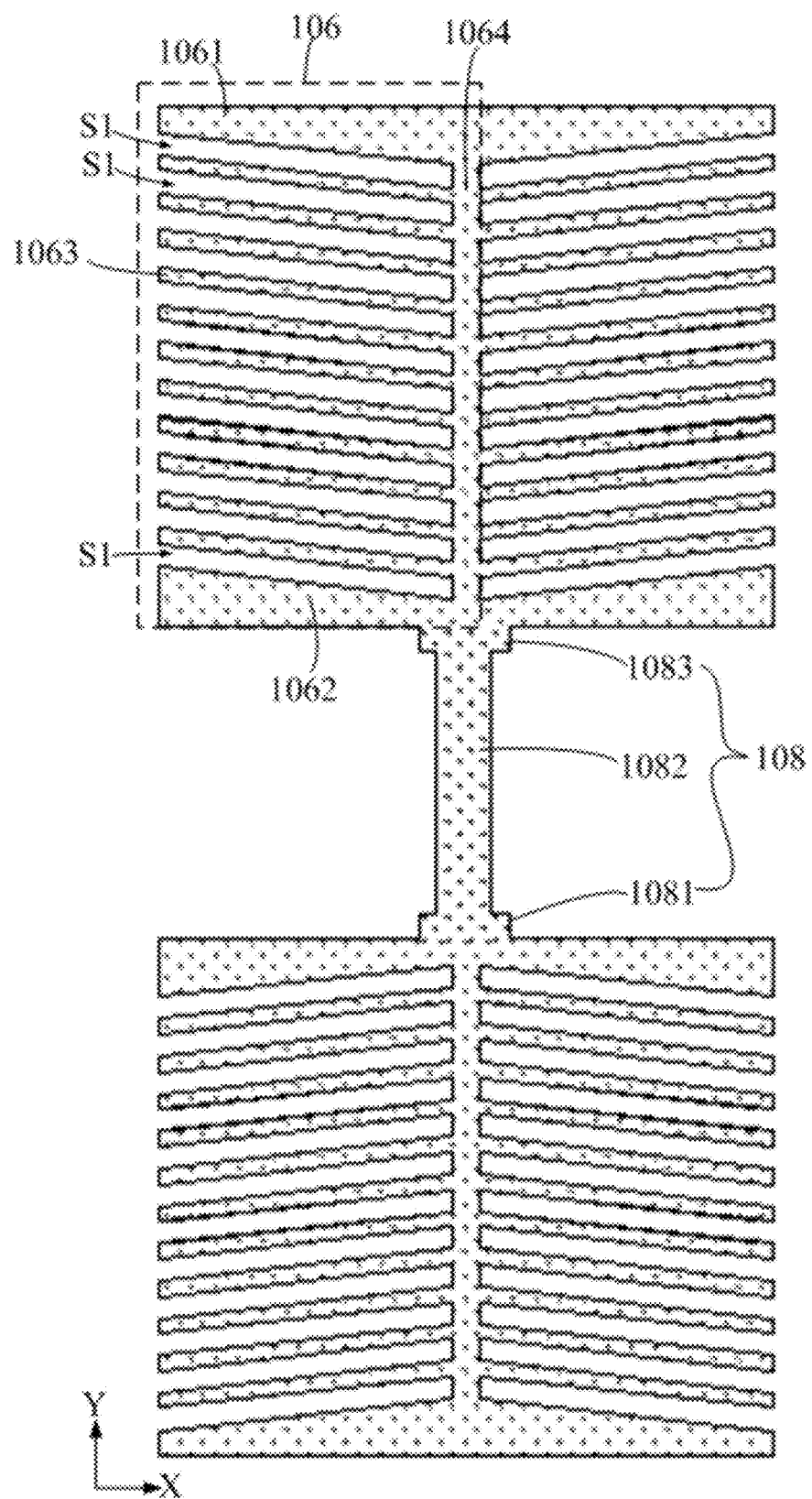
FIG. 11 shows a schematic diagram of arrangement of a plurality of electrode mirrored units according to another embodiment of the present disclosure.

A main difference between the second scheme and the first scheme is that as shown in FIG. 11, two adjacent common electrodes 106 in the column direction Y are arranged in mirror symmetry with respect to the row direction X, so that a viewing angle can be enlarged, that is, products with this characteristic can be applied to products with a wide viewing angle. It should be noted that, in this scheme, the common electrode 106 is also the single-domain structure, and other designs of the common electrode 106 can refer to the description of the first scheme, which will not be repeated here.

Third Scheme

Figure 12:
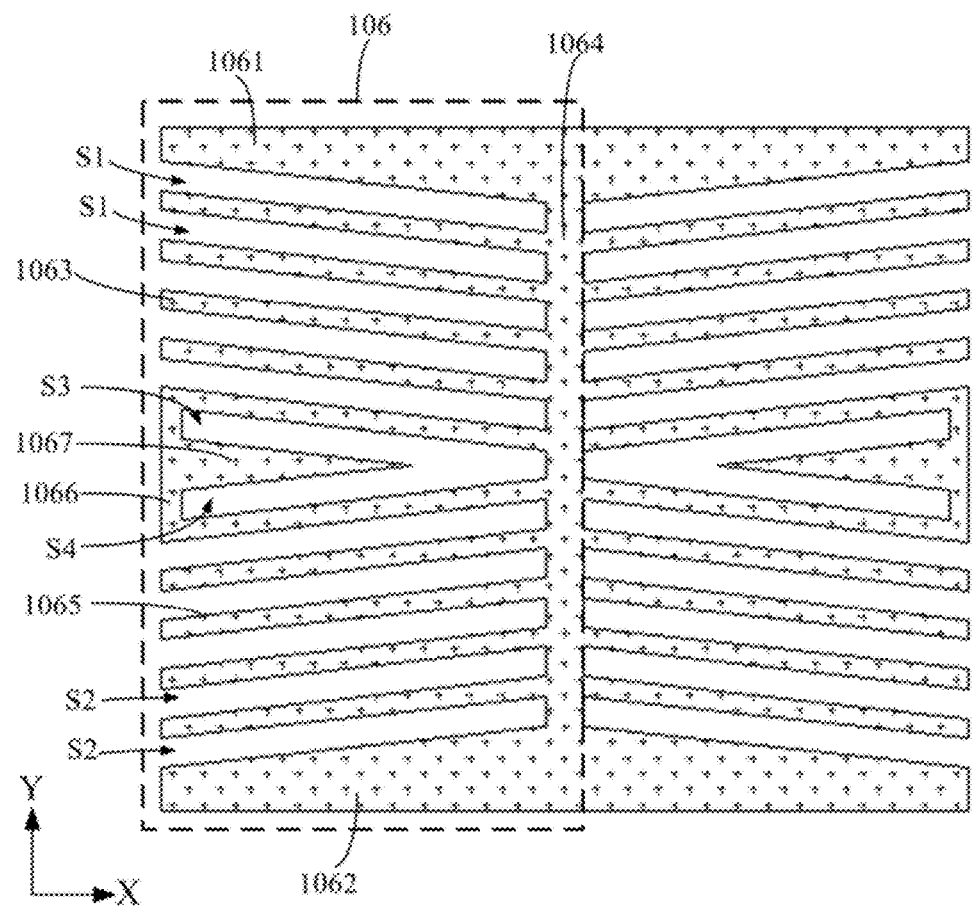
FIG. 12 shows a schematic structural diagram of an electrode mirrored unit in an array substrate according to another embodiment of the present disclosure.

The common electrode in this scheme has a dual-domain structure. Specifically, as shown in FIG. 12, the common electrode 106 has a first group and a second group arranged in the column direction Y, and the first group includes a plurality of first electrode strips 1063 spaced in the column direction Y and a first edge conductive portion 1061 on a side of the plurality of first electrode strips 1063 away from the second group; and the second group includes a plurality of second electrode strips 1065 spaced in the column direction Y and a second edge conductive portion 1062 on a side of the plurality of second electrode strips 1065 away from the first group. The common electrode 106 also has a first conductive connection strip 1064 extending in the column direction Y, the first conductive connection strip 1064 is located on the same side of the first group and the second group in the row direction X, and is coupled to the first edge conductive portion 1061, each first electrode strip 1063, each second electrode strip 1065 and the second edge conductive portion 1062.

In the common electrode 106, a gap between the first electrode strip 1063 and the first edge conductive portion 1061 and a gap between two adjacent first electrode strips 1063 are both first gaps 51, and a gap between the second electrode strip 1065 and the second edge conductive portion 1062 and a gap between two adjacent second electrode strips 1065 are both second gaps S2, and an extension direction of the first gap 51 is the same as that of the first electrode strip 1063 and is intersected with both the row direction X and the column direction Y; an extension direction of the second gap S2 is the same as that of the second electrode strip 1065 and is intersected with both the row direction X and the column direction Y, and the extension direction of the first electrode strip 1063 is intersected with the extension direction of the second electrode strip 1065.

Optionally, the common electrode 106 further has a second conductive connection strip 1066 and a conductive adjustment portion 1067 coupled to the second conductive connection strip 1066, and the second conductive connection strip 1066 extends in the column direction Y, and the conductive adjustment portion 1067 is located on a side of the second conductive connection strip 1066 close to the first conductive connection strip 1064 and between the first group and the second group.

Ends of a first electrode strip 1063 in the first group close to the second group and a second electrode strip 1065 in the second group close to the first group away from the first conductive connection strip 1064 are both coupled to the second conductive connection strip 1066. A gap formed between the conductive adjustment portion 1067 and the first electrode strip 1063 is a third gap S3, and an extension direction of the third gap S3 is the same as that of the first gap 51. A gap formed between the conductive adjustment portion 1067 and the second electrode strip 1065 is a fourth gap S4, and an extension direction of the fourth gap S4 is the same as that of the second gap S2.

In this scheme, by arranging the second conductive connection strip 1066 and the conductive adjustment portion 1067 coupled to the second conductive connection strip 1066, an electric field of the common electrode 106 at a junction of the first group and the second group can be guaranteed to be the same as electric fields of the common electrode 106 elsewhere as much as possible, thereby ensuring the display uniformity.

Optionally, in this scheme, a width of the first electrode strip 1063 is equal to a width of the second electrode strip 1065, and widths of the first gap 51, the second gap S2, the third gap S3 and the fourth gap S4 are all equal.

In this scheme, ends of the first gap 51 and the second gap S2 away from the first conductive connection strip 1064 are open-shaped, that is, the position of the common electrode 106 of each sub-pixel close to the data line 102 is designed with an opening. Compared with a scheme in which the gap is closed all around, a dark field region of the pixel can be reduced and the aperture ratio of the pixel can be improved.

It should be understood that the common electrode 106 of the present disclosure can be an integrated structure, and the common electrode 106 is arranged in mirror symmetry with respect to the row direction X, so as to ensure the display uniformity of the common electrode 106.

The above three schemes are preferable schemes of the common electrode 106 in the embodiments of the present disclosure, that is, any one of the above three schemes can be adopted for the common electrode 106 in the embodiments of the present disclosure; however, it should be understood that the common electrode 106 is not limited to the above-mentioned three schemes, and can also adopt a single-domain structure in which all sides of the gap are closed (a difference from the above-mentioned first scheme is that the sides of the gap are closed, and the remaining portions can be the same) or a dual-domain structure in which all sides of the gap are closed (a difference from the above-mentioned third scheme is that the sides of each gap are closed, and the remaining portions can be the same), depending on the specific situation.

Based on the common electrode 106 mentioned in any of the foregoing schemes, optionally, as shown in FIG. 10 and FIG. 12, in the pixel group A, common electrodes 106 of the two sub-pixels are arranged in mirror symmetry with respect to the column direction Y, and share the first conductive connection strip 1064 to form an electrode mirrored unit. Such design can save design space, and can also reduce the dark field region to increase the light transmittance.

Figure 13:
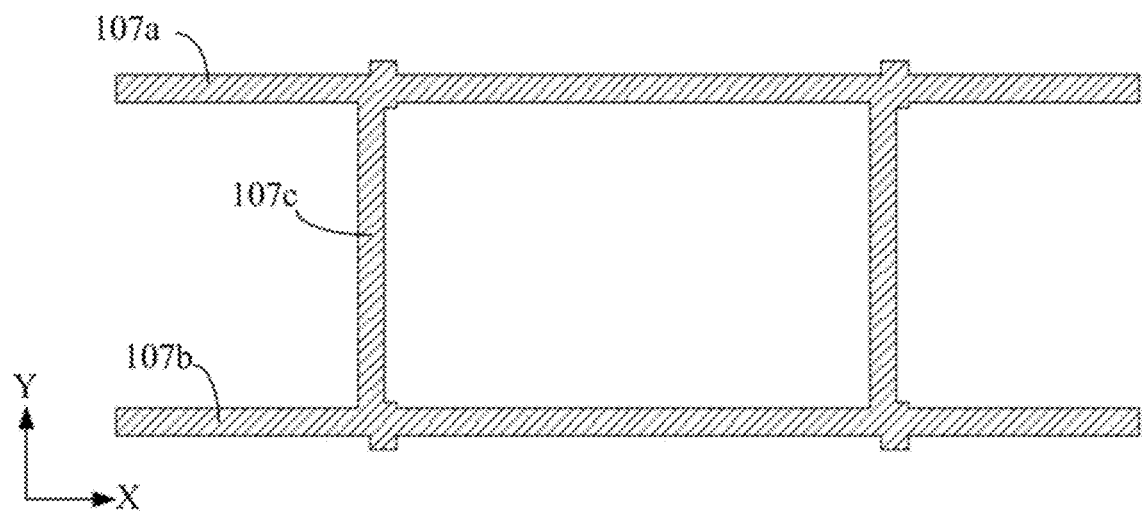
FIG. 13 shows a schematic structural diagram of a common line group in the array substrate shown in FIG. 5.
Figure 14:
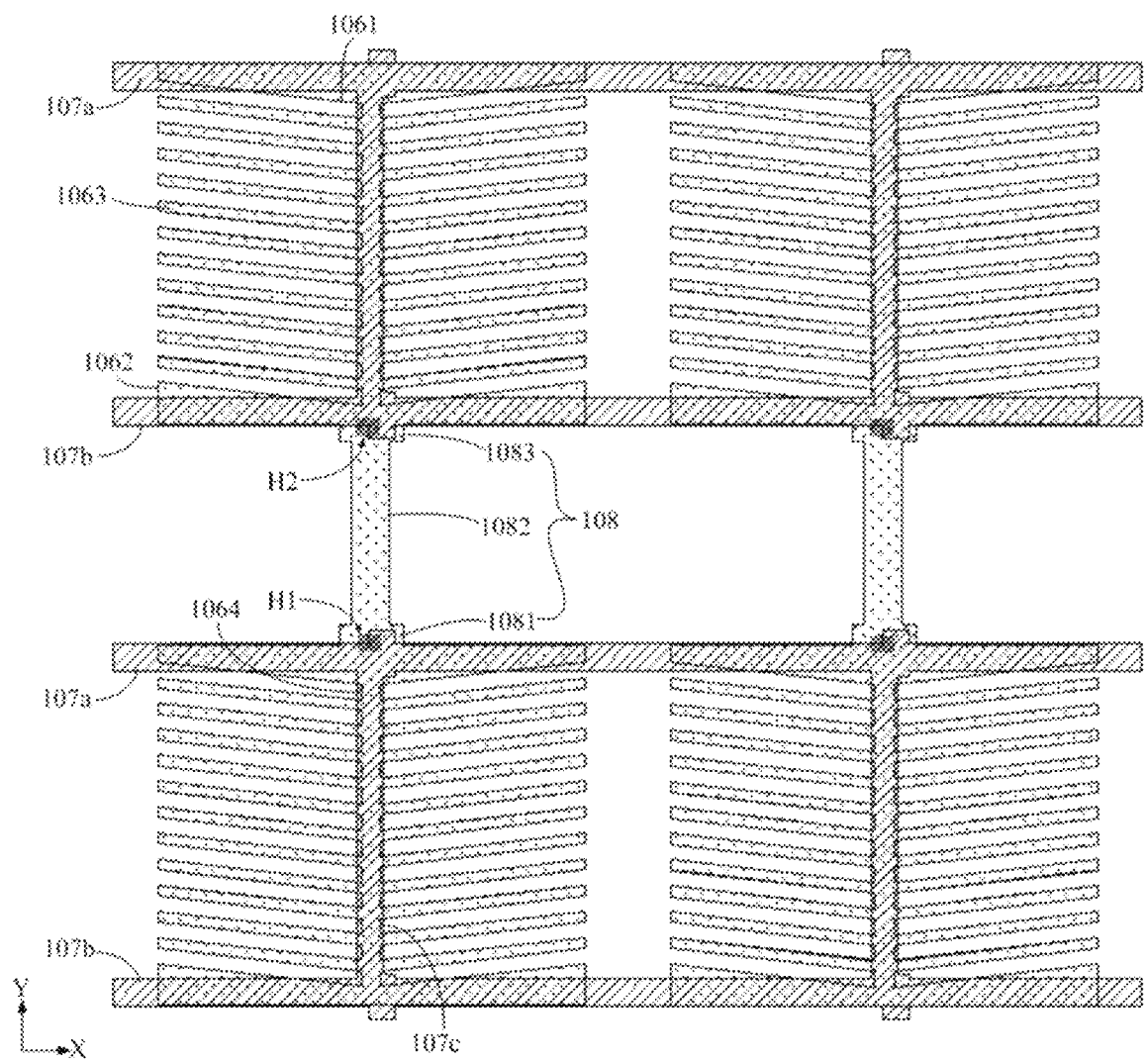
FIG. 14 shows a schematic diagram of a positional relationship between a plurality of electrode mirrored units and a common line group according to an embodiment of the present disclosure.

In the embodiments of the present disclosure, as shown in FIG. 5, FIG. 13 and FIG. 14, the array substrate 10 may further include a plurality of common line groups, and each common line group is located between the first scan line 103a and the second scan line 103b of one of the scan line groups; and each common line group includes two rows of common lines arranged on the same layer as the scan lines, which are respectively a first common line 107a and a second common line 107b, and the first common line 107a and the second common line 107b in each common line group are respectively located on opposite sides of each row of the pixel groups A in the column direction Y.

An orthographic projection of the first edge conductive portion 1061 of the electrode mirrored unit on the first substrate 101 is overlapped with an orthographic projection of the first common line 107a on the first substrate 101, and is coupled to the first common line 107a through a first transferring via hole H1. An orthographic projection of the second edge conductive portion 1062 of the electrode mirrored unit on the first substrate 101 is overlapped with an orthographic projection of the second common line 107b on the first substrate 101, and is coupled to the second common line 107b through a second transferring via hole H2.

Optionally, as shown in FIG. 5, FIG. 13 and FIG. 14, an orthographic projection of at least part of the first transferring via hole H1 on the first substrate 101 is overlapped with an orthographic projection of the first common line 107a on the first substrate 101. An orthographic projection of at least part of the second transferring via hole H2 on the first substrate 101 is overlapped with an orthographic projection of the second common line 107b on the first substrate 101.

Specifically, an orthographic projection of a part of the first transferring via hole H1 on the first substrate 101 is overlapped with the orthographic projection of the first common line 107a on the first substrate 101, and an orthographic projection of another part of the first transferring via hole H1 on the first substrate 101 is located outside the orthographic projection of the first common line 107a on the first substrate 101 (that is, without overlapping with the orthographic projection of the first common line 107a on the first substrate 101) to improve the diffusion uniformity of the subsequent alignment film; similarly, an orthographic projection of a part of the second transferring via hole H2 on the first substrate 101 is overlapped with an orthographic projection of the second common line 107b on the first substrate 101, and an orthographic projection of another part of the second transferring via hole H2 on the first substrate 101 is located outside the orthographic projection of the second common line 107b on the first substrate 101 (that is, without overlapping with the orthographic projection of the second common line 107b on the first substrate 101).

In the embodiments of the present disclosure, as shown in FIG. 13, each common line group may further include a plurality of common connection lines 107c spaced in the row direction X and located between the first common line 107a and the second common line 107b, and the common connection line 107c extends in the column direction Y and is arranged on the same layer as the scan line, and two ends of the common connection line 107c are respectively coupled to the first common line 107a and the second common line 107b. Such design can ensure common signal uniformity to improve the display uniformity.

An orthographic projection of the first conductive connection strip 1064 of each electrode mirrored unit on the first substrate 101 may be located within an orthographic projection of a common connection line 107c on the first substrate 101. Such design can reduce the dark field region to improve transmittance.

It should be understood that the orthographic projection of any structure in the common line group on the first substrate 101 in the embodiments of the present disclosure does not overlap with the orthographic projection of any structure in the scan line group on the first substrate 101.

In the embodiments of the present disclosure, as shown in FIG. 5, FIG. 10 and FIG. 11, a jumper line 108 may also be disposed between two adjacent electrode mirrored units in the column direction Y, and the jumper wire 108 is arranged on the same layer as the electrode mirrored unit, and is coupled to two adjacent electrode mirrored units in the column direction Y so as to further ensure the common signal uniformity and improve the display uniformity.

Optionally, as shown in FIG. 10 and FIG. 11, the jumper wire 108 has a first connection portion 1081, an intermediate connection portion 1082 and a second connection portion 1083 which are sequentially arranged and connected in the column direction Y, and widths of the first connection portion 1081 and the second connection portion 1083 are greater than a width of the intermediate connection portion 1082. An intermediate region of an edge of one of two adjacent electrode mirrored units in the column direction Y is coupled to the first connection portion 1081, and an intermediate region of an edge of the other of the two adjacent electrode mirrored units is coupled to the second connection portion 1083.

Further, an orthographic projection of the first connection portion 1081 on the first substrate 101 is at least partially overlapped with an orthographic projection of the first transferring via hole H1 on the first substrate 101; that is, the first connection portion 1081 can be coupled to the first common line 107a through the first transferring via hole H1. An orthographic projection of the second connection portion 1083 on the first substrate 101 is at least partially overlapped with an orthographic projection of the second transferring via hole H2 on the first substrate 101, and the second connection portion 1083 can be coupled to the second common line 107b through the second transferring via hole H2.

In the embodiments of the present disclosure, by designing the widths of the first connection portion 1081 and the second connection portion 1083 of the jumper wire 108 to be larger than the width of the intermediate connection portion 1082, while reducing the generation of parasitic capacitance, a connection area at the transferring via holes H1 and H2 mentioned above can also be guaranteed, thereby ensuring connection stability at the transferring via holes H1 and H2.

Figure 15:
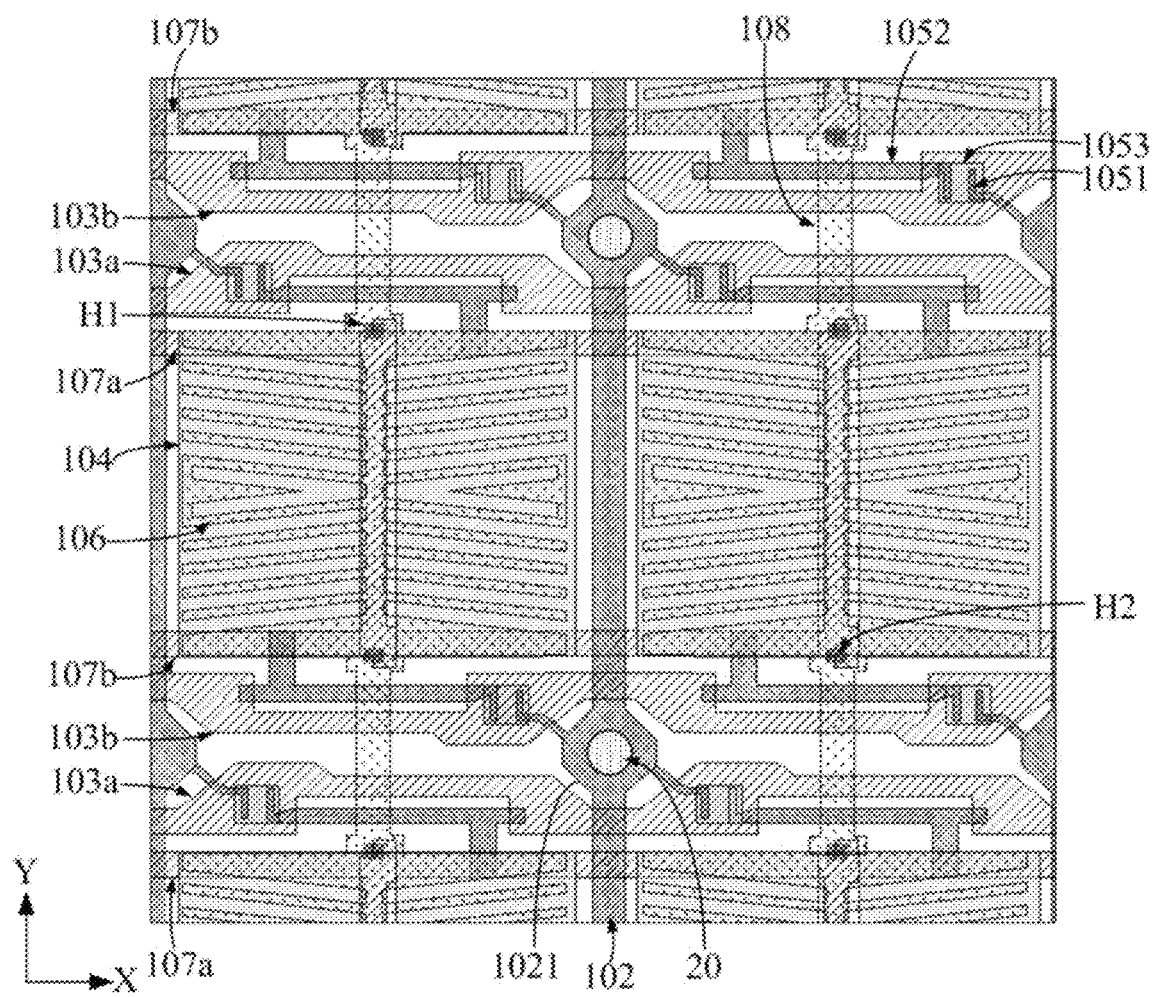
FIG. 15 shows a schematic diagram of a positional relationship between the array substrate shown in FIG. 5 and a spacer.

In the embodiments of the present disclosure, as shown in FIGS. 5 and 15, the data line 102 has an alignment portion 1021 configured to be aligned with a spacer 20, and an orthographic projection of the alignment portion 1021 on the first substrate 101 is located between two adjacent rows of the pixel groups A, so that an orthographic projection of the spacer 20 on the first substrate 101 is located between two adjacent rows of pixel groups A. In this way, a case where the spacer 20 slips to an opening region during a drop test or a pressure test and causes light leakage can be avoided, and product reliability can be guaranteed. In order to ensure the support stability of the spacer 20, the alignment portion 1021 of the data line 102 can be designed to be wider, and in order to ensure the light transmittance, widths of other portions of the data line 102 except for the alignment portion 1021 are designed to be narrow; that is, the widths of other portions of the data line 102 except the alignment portion 1021 are smaller than a width of the alignment portion 1021. An orthographic projection of a surface of the spacer 20 close to the array substrate 10 on the first substrate 101 is located within an orthographic projection of the alignment portion 1021 on the first substrate 101.

Optionally, the orthographic projection of the alignment portion 1021 on the first substrate 101 is located between orthographic projections of the first scan line 103a of one of two adjacent scan line groups and the second scan line 103b of the other of the two adjacent scan line groups on the first substrate 101. Such design can use the overlapping portion of the first scan line 103a and the data line 102 and the overlapping portion of the second scan line 103b and the data line 102 as a retaining wall to further avoid the case where the spacer 20 slips to the opening region during the drop test or the pressure test and causes the light leakage, and guarantee the product reliability.

It should be understood that the orthographic projection of the alignment portion 1021 of the data line 102 on the first substrate 101 is not overlapped with the orthographic projection of any structure in the aforementioned common line group and scan line group on the first substrate 101.

An embodiment of the present disclosure also provides a display device, which may be a liquid crystal display device, but is not limited thereto. Moreover, the display device of the embodiments of the present disclosure may include the array substrate 10 described in any of the foregoing embodiments, which will not be repeated here. In addition, the display device may further include a opposite substrate (not shown in the figure) arranged in cell alignment with the array substrate 10 and a liquid crystal layer (not shown in the figure) located between the array substrate 10 and the opposite substrate. Liquid crystal molecules of the liquid crystal layer can be negative liquid crystals to improve the transmittance, but not limited thereto, and can also be positive liquid crystals.

In the embodiments of the present disclosure, the display device may further include the aforementioned spacer 20, and the spacer 20 may be integrated on the opposite substrate, but is not limited thereto, and may also be integrated on the array substrate 10, depending on the specific situation.

The opposite substrate of the present disclosure may include a second substrate (not shown in the figure) and a black matrix layer (not shown in the figure) located on a side of the second substrate close to the array substrate 10, and the black matrix layer may have a blocking region and a light-transmitting region. An orthographic projection of the blocking region on the first substrate 101 completely covers the transistors, scan line groups, data lines 102, common line groups and spacers 20 of the sub-pixels, and the blocking region 601 can also cover edges of the common electrode 106 and the pixel electrode 104; and an orthographic projection of the light-transmitting region on the first substrate 101 may be located within the orthographic projections of the common electrode 106 and the pixel electrode 104 on the first substrate 101.

In addition, the opposite substrate of the present disclosure may further include a color filter layer, and the color filter layer may include a red filter block, a green filter block, a blue filter block, and the like.

It should be noted that, the color filter layer is not limited to be integrated in the opposite substrate, but can also be integrated in the array substrate 10, depending on the specific situation.

According to the embodiments of the present disclosure, a specific type of the display device is not particularly limited, and any type of display device commonly used in the art can be used, such as a TV, a vehicle-mounted display, etc., and those skilled in the art can make choice according to a specific use of the display device, which will not be repeated here.

It should be noted that in addition to the aforementioned array substrate, opposite substrate and liquid crystal layer, the display device also includes other necessary components and constituent parts. Taking the display as an example, it may also include a backlight module, a house, and a main circuit board, a power wire, etc., those skilled in the art can make corresponding supplements according to the specific usage requirements of the display device, which will not be repeated here.

Other embodiments of the present disclosure will be apparent to those skilled in the art from consideration of the specification and practice of the present disclosure disclosed herein. The present application is intended to cover any variations, uses, or adaptations of the present disclosure, which are in accordance with the general principles of the present disclosure and include common general knowledge or conventional technical means in the art that are not disclosed in the present disclosure. The specification and embodiments are illustrative, and the real scope and spirit of the present disclosure is defined by the appended claims.

What is claimed is:

1. An array substrate, comprising: a first substrate, and a plurality of pixel groups and a plurality of columns of data lines formed on the first substrate;
   wherein the plurality of pixel groups are arranged in an array along a row direction and a column direction, and each pixel group comprises two sub-pixels arranged in the row direction; at least one sub-pixel of a first one of any two adjacent pixel groups in the row direction corresponds to a same color as one sub-pixel of a second one of the two adjacent pixel groups; and any two adjacent sub-pixels in the row direction correspond to different colors; and
   each column of data line and each column of pixel groups are alternately arranged in the row direction, each column of data line is coupled to respective sub-pixels located in a same column and corresponding to the same color, and each column of data line is coupled to two sub-pixels in two pixel groups located on adjacent two sides of the data line in the row direction, wherein in the two sub-pixels connected to the data line in the row direction, the sub-pixel in the pixel group located on one side of the data line has a same color with the sub-pixel in the pixel group located on the other side of the data line.

2. The array substrate according to claim 1, wherein the array substrate further comprises a plurality of scan line groups;
   each scan line group comprises two rows of scan lines, which are respectively a first scan line and a second scan line, and the first scan line and the second scan line in each scan line group are respectively located at opposite sides of each row of pixel groups in the column direction; and
   sub-pixels located in even-numbered columns are coupled to adjacent first scan lines, and sub-pixels located in odd-numbered columns are coupled to adjacent second scan lines.

3. The array substrate according to claim 2, wherein,
   each row of sub-pixels is divided into a plurality of pixel units arranged in sequence in the row direction, and each pixel unit comprises a first sub-pixel, a second sub-pixel and a third sub-pixel arranged in sequence in the row direction; and
   colors corresponding to the first sub-pixel, the second sub-pixel and the third sub-pixel are all different.

4. The array substrate according to claim 3, wherein the sub-pixel comprises a pixel electrode and a transistor; wherein,
   a gate of the transistor is a part of a structure of the scan line;
   a first electrode of the transistor is arranged on a same layer as the data line and coupled to the data line; and
   a second electrode of the transistor is arranged on the same layer as the data line, and a part of the second electrode of the transistor is in contact with the pixel electrode.

5. The array substrate according to claim 4, wherein,
   the scan line comprises a plurality of scan segments that are sequentially arranged and connected in the row direction; each scan segment comprises a first portion, a transition connection portion and a second portion that are sequentially arranged and connected in the row direction; widths of the first portion and the second portion are greater than that of the transition connection portion; and a recess structure is formed by the first portion, the transition connection portion and the second portion;
   an orthographic projection of an active layer of the transistor on the first substrate is located within an orthographic projection of the first portion on the first substrate, and the gate of the transistor is constituted by a part of the first portion;
   the second electrode of the transistor comprises a first contact portion in contact with the pixel electrode, a second contact portion in contact with the active layer, and an electrode connection portion coupling the first contact portion and the second contact portion; and
   an orthographic projection of the electrode connection portion of the second electrode on the first substrate is overlapped with orthographic projections of the first portion, the second portion and the recess structure on the first substrate, and is not overlapped with an orthographic projection of the transition connection portion on the first substrate.

6. The array substrate according to claim 3, wherein, in each of the scan line groups:
   a first portion of the first scan line is aligned to a second portion of the second scan line in the column direction, and a second portion of the first scan line is aligned to a first portion of the second scan line in the column direction; and
   a notch orientation of a recess structure of the first scan line is opposite to a notch orientation of the second scan line.

7. The array substrate according to claim 4, wherein,
   the sub-pixel further comprises a common electrode, and the common electrode is located on a side of the pixel electrode away from the first substrate and is insulated from the pixel electrode; and
   an orthographic projection of the common electrode on the first substrate is overlapped with an orthographic projection of the pixel electrode on the first substrate.

8. The array substrate according to claim 7, wherein,
   the common electrode comprises a first edge conductive portion and a second edge conductive portion that are opposite and spaced in the column direction, and a plurality of first electrode strips located between the first edge conductive portion and the second edge conductive portion and spaced in the column direction;
   the common electrode further comprises a first conductive connection strip extending in the column direction, and the first conductive connection strip is located on a same side of the first edge conductive portion, the second edge conductive portion and the plurality of first electrode strips in the row direction, and is coupled to the first edge conductive portion, the second edge conductive portion and the plurality of first electrode strips; and in the common electrode, a gap between the first electrode strip and the first edge conductive portion, a gap between two adjacent first electrode strips, and a gap between the first electrode strip and the second edge conductive portion are all first gaps, an extension direction of each first gap is same as that of each first electrode strip, and the extension direction of the first electrode strip is intersected with both the row direction and the column direction.

9. The array substrate according to claim 7, wherein, the common electrode has a first group and a second group arranged in the column direction, and the first group comprises a plurality of first electrode strips spaced in the column direction and a first edge conductive portion on a side of the plurality of first electrode strips away from the second group; and the second group comprises a plurality of second electrode strips spaced in the column direction and a second edge conductive portion on a side of the plurality of second electrode strips away from the first group;

the common electrode further has a first conductive connection strip extending in the column direction, the first conductive connection strip is located on a same side of the first group and the second group in the row direction, and is coupled to the first edge conductive portion, each first electrode strip, each second electrode strip and the second edge conductive portion; and in the common electrode, a gap between the first electrode strip and the first edge conductive portion and a gap between two adjacent first electrode strips are both first gap, a gap between the second electrode strip and the second edge conductive portion and a gap between two adjacent second electrode strips are both second gaps, and an extension direction of each first gap is same as that of each first electrode strip and is intersected with both the row direction and the column direction; an extension direction of each second gap is same as that of each second electrode strip and is intersected with both the row direction and the column direction, and the extension direction of the first electrode strip is intersected with the extension direction of the second electrode strip.

10. The array substrate according to claim 9, wherein the common electrode further has a second conductive connection strip and a conductive adjustment portion coupled to the second conductive connection strip, and the second conductive connection strip is extended in the column direction, and the conductive adjustment portion is located on a side of the second conductive connection strip close to the first conductive connection strip and between the first group and the second group;

ends of a first electrode strip in the first group close to the second group and a second electrode strip in the second group close to the first group away from the first conductive connection strip are both coupled to the second conductive connection strip;

a gap formed between the conductive adjustment portion and the first electrode strip is a third gap, and an extension direction of the third gap is same as that of the first gap; and a gap formed between the conductive adjustment portion and the second electrode strip is a fourth gap, and an extension direction of the fourth gap is same as that of the second gap.

11. The array substrate according to claim 8, wherein, in the pixel group, common electrodes of the two sub-pixels are arranged in mirror symmetry with respect to the column direction, and share the first conductive connection strip to form an electrode mirrored unit.

12. The array substrate according to claim 11, wherein the array substrate further comprises a plurality of common line groups, and each common line group is located between the first scan line and the second scan line of one of the scan line groups; and each common line group comprises two rows of common lines arranged on a same layer as the scan lines, which are respectively a first common line and a second common line, and the first common line and the second common line in each common line group are respectively located on opposite sides of each row of the pixel groups in the column direction;

an orthographic projection of the first edge conductive portion of the electrode mirrored unit on the first substrate is overlapped with an orthographic projection of the first common line on the first substrate, and is coupled to the first common line through a first transferring via hole; and an orthographic projection of the second edge conductive portion of the electrode mirrored unit on the first substrate is overlapped with an orthographic projection of the second common line on the first substrate, and is coupled to the second common line through a second transferring via hole.

13. The array substrate according to claim 12, wherein, an orthographic projection of at least part of the first transferring via hole on the first substrate is overlapped with an orthographic projection of the first common line on the first substrate; and an orthographic projection of at least part of the second transferring via hole on the first substrate is overlapped with an orthographic projection of the second common line on the first substrate.

14. The array substrate according to claim 12, wherein each common line group further comprises a plurality of common connection lines spaced in the row direction and located between the first common line and the second common line, and the common connection line extends in the column direction and is arranged on the same layer as the scan line, and two ends of the common connection line are respectively coupled to the first common line and the second common line; and an orthographic projection of the first conductive connection strip of each electrode mirrored unit on the first substrate is located within an orthographic projection of a common connection line on the first substrate.

15. The array substrate according to claim 14, wherein, a jumper wire is further disposed between two adjacent electrode mirrored units in the column direction; and the jumper wire is arranged on a same layer as the electrode mirrored unit, and is coupled to two adjacent electrode mirrored units in the column direction.

16. The array substrate according to claim 15, wherein the jumper wire has a first connection portion, an intermediate connection portion and a second connection portion which are sequentially arranged and connected in the column direction, and widths of the first connection portion and the second connection portion are greater than a width of the intermediate connection portion; and an intermediate region of an edge of one of two adjacent electrode mirrored units in the column direction is coupled to the first connection portion, and an intermediate region of an edge of the other of the two adjacent electrode mirrored units is coupled to the second connection portion.

17. The array substrate according to claim 16, wherein,
an orthographic projection of the first connection portion on the first substrate is at least partially overlapped with an orthographic projection of the first transferring via hole on the first substrate; and
an orthographic projection of the second connection portion on the first substrate is at least partially overlapped with an orthographic projection of the second transferring via hole on the first substrate.

18. The array substrate according to claim 2, wherein the data line has an alignment portion configured to be aligned with a spacer, and an orthographic projection of the alignment portion on the first substrate is located between two adjacent rows of the pixel groups; and
widths of other portions of the data line except the alignment portion are smaller than a width of the alignment portion; and an orthographic projection of a surface of the spacer close to the array substrate on the first substrate is located within an orthographic projection of the alignment portion on the first substrate.

19. The array substrate according to claim 18, wherein the orthographic projection of the alignment portion on the first substrate is located between orthographic projections of the first scan line of one of two adjacent scan line groups and the second scan line of the other of the two adjacent scan line groups on the first substrate.

20. A display device, comprising the array substrate according to claim 1 and an opposite substrate arranged in cell alignment with the array substrate.

* * * * *